(12) United States Patent
Arita et al.

(10) Patent No.: US 9,068,817 B2
(45) Date of Patent: Jun. 30, 2015

(54) LOCATION DETECTOR DEVICE

(75) Inventors: Hideaki Arita, Tokyo (JP); Toshiyuki Yoshizawa, Tokyo (JP); Kenta Hatano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 17 days.

(21) Appl. No.: 14/122,643

(22) PCT Filed: Oct. 14, 2011

(86) PCT No.: PCT/JP2011/005766
§ 371 (c)(1),
(2), (4) Date: Nov. 26, 2013

(87) PCT Pub. No.: WO2013/054384
PCT Pub. Date: Apr. 18, 2013

(65) Prior Publication Data
US 2014/0097830 A1 Apr. 10, 2014

(51) Int. Cl.
G01B 7/14 (2006.01)
G01D 3/036 (2006.01)
G01D 5/14 (2006.01)
H05K 3/12 (2006.01)

(52) U.S. Cl.
CPC ............... *G01B 7/14* (2013.01); *G01D 3/0365* (2013.01); *G01D 5/145* (2013.01); *H05K 3/1225* (2013.01)

(58) Field of Classification Search
CPC ....... G01D 5/145; G01D 3/0365; G01B 7/14; G01B 7/0003
USPC .................................................. 324/207.13
See application file for complete search history.

(56) References Cited

U.S. PATENT DOCUMENTS

| | | | |
|---|---|---|---|
| 5,757,179 A | 5/1998 | McCurley et al. | |
| 5,869,962 A * | 2/1999 | Kasumi et al. | ........... 324/207.21 |
| 6,211,668 B1 | 4/2001 | Duesler et al. | |
| 6,568,284 B1 | 5/2003 | Reichl et al. | |
| 7,710,109 B2 * | 5/2010 | Baak | .......... 324/207.24 |
| 2002/0190874 A1 | 12/2002 | Tokunaga et al. | |
| 2005/0012500 A1 | 1/2005 | Braun et al. | |

FOREIGN PATENT DOCUMENTS

| | | |
|---|---|---|
| JP | 4-278415 A | 10/1992 |
| JP | 7-280509 A | 10/1995 |
| JP | 2000-180114 A | 6/2000 |
| JP | 2002-530637 A | 9/2002 |
| JP | 2002-372402 A | 12/2002 |
| JP | 2005-515459 A | 5/2005 |

* cited by examiner

*Primary Examiner* — Reena Aurora
(74) *Attorney, Agent, or Firm* — Birch, Stewart, Kolasch & Birch, LLP

(57) ABSTRACT

A permanent magnet 60 for biasing is placed between opposite surfaces of a second stationary magnetic body 20 and a third stationary magnetic body 30, and a range in magnetic flux density detected by a magnetic sensor 50 is changed to thus include zero in the magnetic flux density. A correction and an adjustment of a temperature characteristic and so on of the magnetic sensor 50 are performed in a state of zero in the magnetic flux density.

6 Claims, 13 Drawing Sheets

FIG.2
(a)
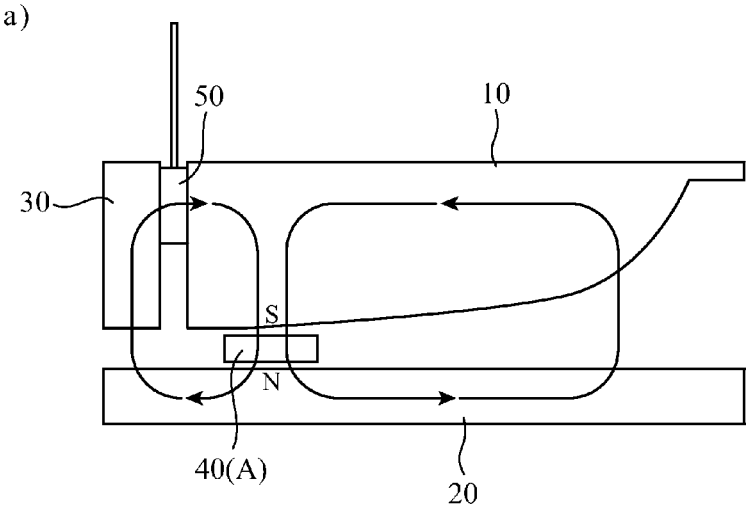
(b)
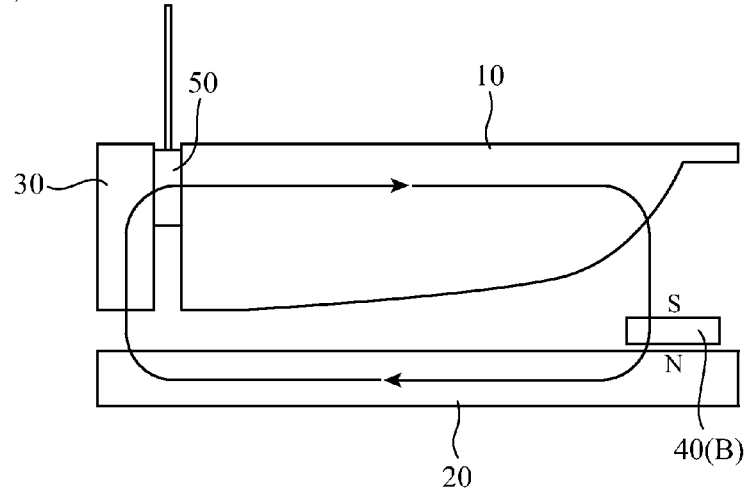

FIG.4
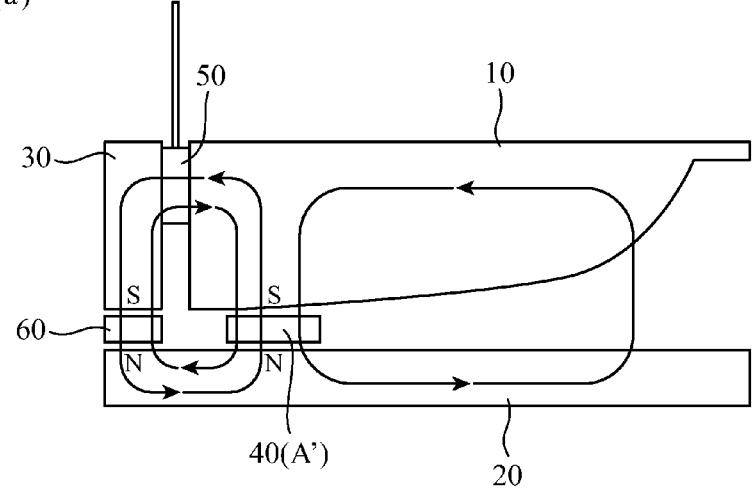
(a)
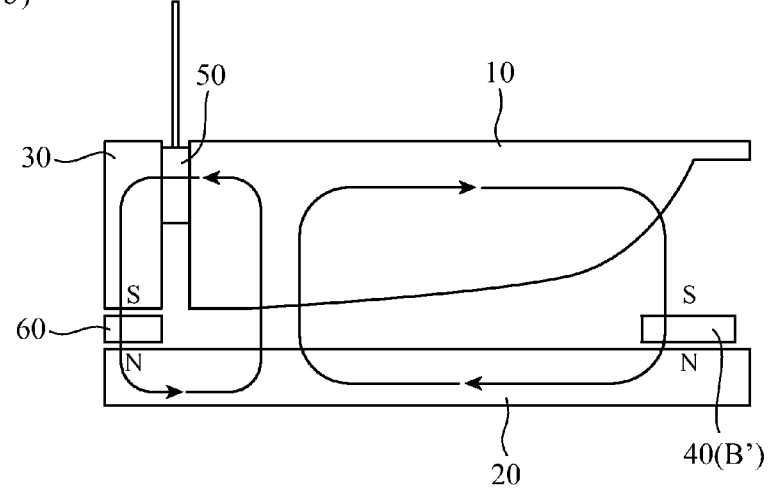
(b)

LOCATION DETECTOR DEVICE

TECHNICAL FIELD

The present invention relates to a location detector for detecting a moving location of a linearly moving object.

BACKGROUND ART

A conventional location detector (device) is disclosed in Patent Document 1, for example. FIG. 16 is a front view showing a configuration of the conventional location detector. The location detector is configured with a first stationary magnetic body (magnetic flux guiding member) 91, a second stationary magnetic body (magnetic flux guiding member) 92, a magnetic field generating body (magnet) 93, and a magnetic sensor (magneto-electric conversion element) 94. The magnetic field generating body 93 moves linearly (in directions shown by arrows X in FIG. 16) between opposite surfaces of the first stationary magnetic body 91 and the second stationary magnetic body 92, and opposite inner-surface sides of these first stationary magnetic body 91 and second stationary magnetic body 92 have a curved shape. When the inner-surface sides of the first stationary magnetic body 91 and second stationary magnetic body 92 are formed in the curved shape, it is contemplated that a distance between the magnetic field generating body 93 and each of the first and second stationary magnetic bodies 91, 92 (shown by arrows Y in FIG. 16) is variable according to a moving location of the magnetic field generating body 93. A variation in the distance (positional relationship) changes a magnetic flux density passing through the magnetic sensor 94 according to the moving location of the magnetic field generating body 93. A change amount of the magnetic flux density is detected by the magnetic sensor 94, and converted into an electric signal. Since the electric signal is a signal having a linear relationship with the location of the magnetic field generating body 93, location information of the magnetic field generating body 93 can be detected from the output signal of the magnetic sensor 94.

PRIOR ART DOCUMENTS

Patent Documents

Patent Document 1: Japanese National Publication of International Patent Application No. 2005-515459

SUMMARY OF THE INVENTION

Problems to be Solved by the Invention

A typical Hall element incorporated in a magnetic sensor has a temperature characteristic changing its sensitivity depending on a temperature, and the like. Therefore, it is necessary that a variety of corrections and adjustments including firstly a temperature collection are performed to thus enhance detection accuracy thereof; to do this, if the collection is performed in a state of zero in magnetic flux density, the highest accuracy thereof can be achieved.

However, in the conventional location detector, a detection range in the magnetic flux density with a moving distance of the magnetic field generating body 93 is only either one of a plus side or a minus side in the density, not including zero in the magnetic flux density. For this reason, there is a problem such that a correction and an adjustment of the magnetic sensor 94 cannot be performed with high accuracy in a zero state in the magnetic flux density.

The present invention has been made to solve the foregoing problem, and an object of the invention is to obtain a location detector that achieves an improvement of the accuracy based on a collection and an adjustment thereof.

Means for Solving the Problem

A location detector includes: a magnetic field generating body having a polar surface of N-pole, and a polar surface of S-pole on its reverse side, and attached to a reciprocating drive shaft to move in directions perpendicular to a magnetic pole direction in which the N and S poles are aligned; a first stationary magnetic body having a curved portion, and disposed opposite to one of the polar surfaces of the magnetic field generating body; a second stationary magnetic body disposed at a position opposite to the other of the polar surfaces of the magnetic field generating body, and having a linear portion parallel to the moving directions of the magnetic field generating body, the above linear portion being opposite to the curved portion of the first stationary magnetic body with the magnetic field generating body interposed therebetween; a third stationary magnetic body disposed side by side with the first stationary magnetic body at a position opposite to the second stationary magnetic body; a magnetic sensor placed in a state sandwiched between opposite surfaces of the first stationary magnetic body and the third stationary magnetic body, the above sensor detecting a position of the magnetic field generating body due to the fact that when a distance in the magnetic pole direction between the magnetic field generating body and the first stationary magnetic body varies according to a reciprocating movement of the drive shaft, a magnetic flux passing therethrough is changed; and a permanent magnet placed between opposite surfaces of the second stationary magnetic body and the third stationary magnetic body in such a manner that zero is included in a detection range in magnetic flux density thereof when the magnetic flux passing through the magnetic sensor is changed.

EFFECT OF THE INVENTION

According to the present invention, since it is configured that the magnetic flux passing through the magnetic sensor is changed by the permanent magnet to thus include zero in the detection range of the magnetic flex density, a collection and an adjustment of the magnetic sensor can be performed with high accuracy in a state of zero in the magnetic flux density. Thus, the location detector that achieves an improvement of the accuracy by the correction and adjustment can be obtained.

BRIEF DESCRIPTION OF THE DRAWINGS

FIG. 2 is a diagram for illustrating a flow of a magnetic flux in a case of nonexistence of a permanent magnet in the location detector according to Embodiment 1.

FIG. 4 is a diagram illustrating a flow of the magnetic flux in the location detector according to Embodiment 1.

FIG. 7(a) is a side view; and FIG. 7(b) is a front view.

FIG. 11(a) is a side view; and FIG. 11(b) is a front view.

FIG. 14(a) is a plan view; and FIG. 14(b) is a cross-sectional view taken along a line I-I when viewed from arrows.

BEST MODE FOR CARRYING OUT THE INVENTION

Hereinafter, in order to explain the present invention in more detail, embodiments for carrying out the invention will be described with reference to the accompanying drawings.
Embodiment 1

Figure 1:
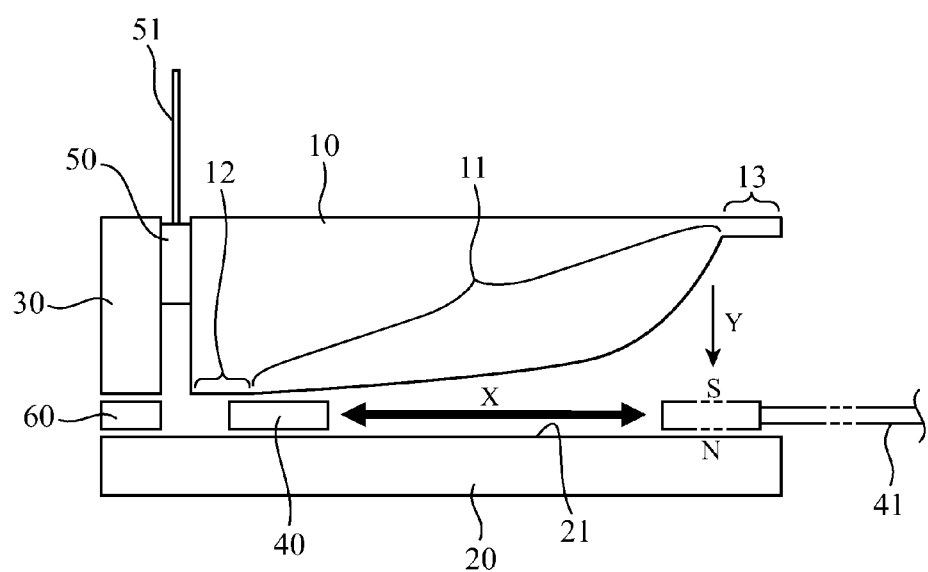
FIG. 1 is a front view showing a basic configuration of a location detector according to Embodiment 1 of the present invention.

FIG. 1 shows a basic configuration diagram of a location detector (device) according to Embodiment 1 of the present invention, and includes: a first stationary magnetic body 10, a second stationary magnetic body 20, and a third stationary magnetic body 30 that constitute a stator; a magnetic field generating body 40 of a permanent magnet; a magnetic sensor 50; and a permanent magnet 60 that constitutes a biasing magnet.

The magnetic field generating body 40 is provided with surfaces having both polarities of N-pole and S-pole, and this magnetic field generating body 40 moves in directions (hereinafter, referred to as moving directions X) that are perpendicular to a direction in which the N-pole and S-pole is aligned (hereinafter, referred to as magnetic pole direction Y). The first stationary magnetic body 10 is disposed opposite to one polar surface of the magnetic field generating body 40, and the second stationary magnetic body 20 is disposed opposite to the other polar surface of the magnetic field generating body 40. In addition, the magnetic field generating body 40 is attached to a drive shaft 41 of an actuator, or the like; when the drive shaft 41 reciprocates (moves linearly) in the moving directions X, the magnetic field generating body 40 united with the drive shaft 41 also moves in the moving directions X.

The magnetic field generating body 40 is a permanent magnet, and a samarium-cobalt-based square magnet, for example, is applied thereto.

The surface of the first stationary magnetic body 10 on the side facing the magnetic field generating body 40 is constituted by a curved portion 11, and linear portions 12, 13 at two sections. In the case of FIG. 1, the linear portions 12, 13 are formed at end portions on both sides in a moving range of the magnetic field generating body 40, and the curved portion 11 is formed between the linear portions 12, 13. The curved portion 11 do not have to be a smooth curve shape, and may be a multangular shape including a large number of straight lines. The linear portions 12, 13 have a linear shape parallel to the moving directions X of the magnetic field generating body 40.

On the other hand, the surface of the second stationary magnetic body 20 on the side facing the magnetic field generating body 40 is constituted by a linear portion 21 that is parallel to the moving directions X of the magnetic field generating body 40. That is, the first stationary magnetic body 10, the magnetic field generating body 40, and the second stationary magnetic body 20 are arranged in the magnetic pole direction Y. Accordingly, it is assumed that in a gap formed between the opposite surfaces of the first stationary magnetic body 10 and the second stationary magnetic body 20, the magnetic field generating body 40 moves with keeping a constant distance to the linear portion 21 of the second stationary magnetic body 20, or slides while abutting on the linear portion 21.

In addition, the third stationary magnetic body 30 is arranged side by side on the same side as that of the first stationary magnetic body 10 with facing the second stationary magnetic body 20.

Further, the magnetic sensor 50 is disposed between the first stationary magnetic body 10 and the third stationary magnetic body 30, and a lead wire (electrode terminal) 51 is led to the outside. In the case of FIG. 1, the magnetic sensor 50 is placed in a state sandwiched between the first stationary magnetic body 10 and the third stationary magnetic body 30, and the lead wire 51 extends in the same direction as that of a clearance between the first stationary magnetic body 10 and the third stationary magnetic body 30. That is, the first stationary magnetic body 10, the magnetic sensor 50, and the third stationary magnetic body 30 are arranged in parallel to the moving directions X.

Furthermore, the permanent magnet 60 is disposed between the second stationary magnetic body 20 and the third stationary magnetic body 30. That is, the third stationary magnetic body 30, the permanent magnet 60, and the second stationary magnetic body 20 are arranged in parallel to the magnetic pole direction Y.

Next, a flow of a magnetic flux in the location detector will be described.

First, a flow of the magnetic flux in a case of nonexistence of the permanent magnet 60 is described with reference to FIG. 2. Here, FIG. 2(a) shows a case where the magnetic field generating body 40 is located at one end side (A) in the moving range, and FIG. 2(b) shows a case where the magnetic field generating body 40 is located at the other end side (B) in the moving range.

In this case, it is assumed that the side of the magnetic filed generating body 40 facing the first stationary magnetic body 10 is magnetized to the S-pole, and the side facing the second stationary magnetic body 20 is magnetized to the N-pole. As shown in FIG. 2(a), when the magnetic field generating body 40 is located at the one end side (A) in the moving directions, a part of the magnetic flux outgoing from the N-pole of the magnetic field generating body 40 enters the second stationary magnetic body 20 through the gap, enters the third stationary magnetic body 30 through the gap (properly, a space in which the permanent magnet 60 exists) again, passes through the magnetic sensor 50, and returns from the first stationary magnetic body 10 to the S-pole of the magnetic field generating body 40 through the gap. Further, the part of the magnetic flux outgoing from the N-pole of the magnetic field generating body 40 enters the second stationary magnetic body 20 through the gap, enters the first stationary magnetic body 10 through the gap again, and returns to the S-pole of the magnetic field generating body 40 through the gap.

As shown in FIG. 2(b), when the magnetic field generating body 40 is located at the other end side (B) in the moving directions, the magnetic flux outgoing from the N-pole of the magnetic field generating body 40 enters the second stationary magnetic body 20 through the gap, enters the third stationary magnetic body 30 through the gap (properly, the space in which the permanent magnet 60 exists) again, passes through the magnetic sensor 50, and returns from the first stationary magnetic body 10 to the S-pole of the magnetic field generating body 40 through the gap.

In this situation, due to the fact that the distance (gap) between the first stationary magnetic body 10 and the second stationary magnetic body 20 varies according to a location of the magnetic field generating body 40, a magnetic resistance in a magnetic circuit thereof is changed, and a magnetic flux (density) to be detected by the magnetic sensor 50 is changed, thereby detecting the location of the magnetic filed generating body 40, and eventually locations of the drive shaft 41 and so on. In this location detector, the shapes of the curved portion 11 and linear portions 12, 13 of the first stationary magnetic body 10 are determined such that a characteristic of the magnetic flux density according to the movement of the magnetic field generating body 40 becomes linear, and hence the magnetic flux density becomes higher as the magnetic field generating body 40 moves toward the linear portion 12, while the magnetic flux density becomes lower as the magnetic filed generating body moves toward the linear portion 13. Further, since the magnetic flux passing through the magnetic sensor 50 has either one of positive and negative intensities, the output signal (voltage value) also becomes either one of positive and negative values corresponding to the intensity of the detected magnetic flux density. The positive or negative of the magnetic flux is determined by a direction of the magnetic poles of the magnetic field generating body 40, and a detecting direction of the magnetic sensor 50.

Figure 3:
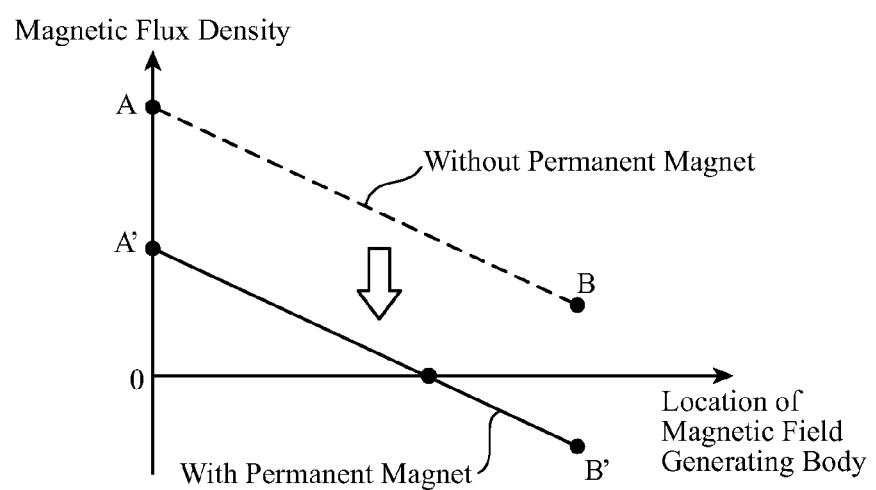
FIG. 3 shows a graph of a magnetic flux density detected by a magnetic sensor in the location detector according to Embodiment 1: a broken line is a case without the permanent magnet; and a solid line is a case with the permanent magnet.

FIG. 3 is a graph of the magnetic flux density detected by the magnetic sensor 50, and a broken line represents a case without the permanent magnet 60. In the graph, the ordinate is the magnetic flux density detected by the magnetic sensor 50, and the abscissa is the location of the magnetic field generating body 40; "A" corresponds to a location (A) of the magnetic field generating body 40 shown in FIG. 2(a), and "B" corresponds to a location (B) of the magnetic field generating body 40 shown in FIG. 2(b). In the case of the configuration shown in FIG. 2, the magnetic sensor 50 detects the magnetic flux density on the positive side.

Next, a flow of the magnetic flux in a case of existence of the permanent magnet 60 will be described with reference to FIG. 4. Here, FIG. 4(a) shows a case where the magnetic field generating body 40 is located at one end side (A') of the moving range, and FIG. 2(b) shows a case where the magnetic field generating body 40 is located at the other end side (B') of the moving range.

In the location detector shown in FIG. 4, based on a location detection theory illustrated in FIG. 2 and FIG. 3, the permanent magnet 60 is disposed in a magnetic circuit. N and S poles of the permanent magnet 60 are established in the same direction as the N and S poles of the magnetic field generating body 40. That is, the permanent magnet 60 generates a magnetic flux in a reverse direction to the direction of the magnetic flux generated by the magnetic filed generating body 40. As a result, the magnetic flux passing through the magnetic sensor 50 is weakened, and the magnetic flux density is weakened on average from the broken line to the solid line as shown in FIG. 3.

When the permanent magnet 60 is absent, the detecting range of the magnetic flux density is only the positive side (broken line in FIG. 3), whereas when the permanent magnet 60 is placed, the detecting range is offset to a range including both of the positive and negative ones (solid line in FIG. 3) because a bias is applied to the magnetic flux generated by the magnetic field generating body 40 due to an effect of the reversed magnetic field. Thus, a point attaining zero in the magnetic flux density can be provided within the moving range of the magnetic field generating body 40.

It is noted that an offset amount for the detecting range of magnetic flux density is freely changable by adjusting the magnetic flux (magnetic force) generated by the permanent magnet 60. As the permanent magnet 60, for example, a samarium-cobalt-based magnet that is the same as the permanent magnet of the magnetic field generating body 40 may be used after adjustment of a residual magnetic flux density thereof. Alternatively, another permanent magnet (for example, a ferrite-based one) that is different in magnetic flux characteristic from the permanent magnet of the magnetic field generating body 40 may be used.

A magnitude relation in magnetic flux density between the permanent magnet 60 and the magnetic field generating body 40 cannot be said sweepingly because it varies depending on magnet size, magnet area, gap, residual magnetic flux density, magnet material, and the like; however, as a rough guide, it is considered that the magnetic flux generated by the permanent magnet 60 performs the one equivalent to or smaller than the magnetic flux generated by the magnetic field generating body 40.

As mentioned above, when a condition where the magnetic flux density attains zero within the moving range of the magnetic field generating body 40 is created, a correction and an adjustment of the magnetic sensor 50 can be performed with high accuracy in a state of zero in the magnetic flux density.

For the magnetic sensor 50, a Hall element (Hall IC) is used, including a temperature detecting element inside, and provided with an ASIC (Application Specific Integrated Circuit; semiconductor device for a specific application) in which a temperature compensating function is programmable; a zero point and an output gradient thereof is adjusted to thus provide a configuration such that no output thereof fluctuates even under a high temperature environment.

For example, when the magnetic flux of the permanent magnet 60 is adjusted so that the magnetic flux density attains zero at the center position in the moving range, a position of the magnetic sensor 50 suitable for the correction and adjustment can be easily located, which results in facilitation of an operation.

In the cases of FIG. 1 to FIG. 4, the following disposition is provided: the S-poles of the magnetic field generating body 40 and the permanent magnet 60 are opposite to the first stationary magnetic body 10 and the third stationary magnetic body 30, respectively, and the N-poles thereof are opposite to the second stationary magnetic body 20; however, the polarities maybe reversed and disposed.

Figure 5:
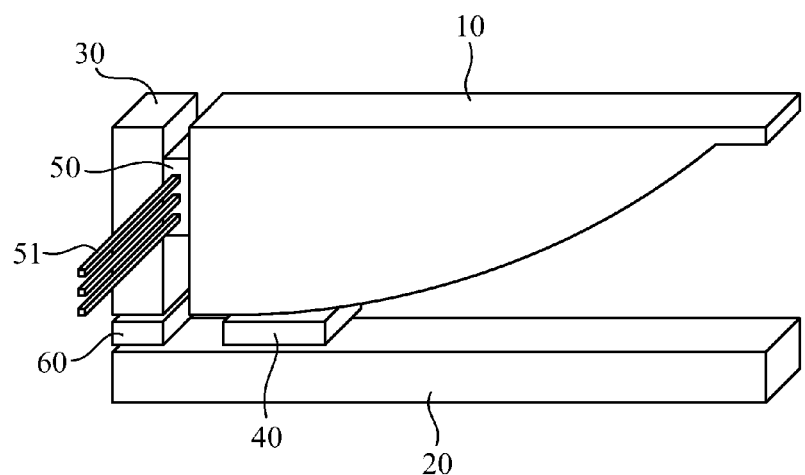
FIG. 5 is an appearance perspective view showing a modified example of the location detector according to Embodiment 1.

In addition, in the cases of FIG. 1 to FIG. 4, the direction of the lead wire 51 of the magnetic sensor 50 is disposed in a parallel direction to the magnetic pole direction Y of the magnetic field generating body 40; however, for example, as shown in FIG. 5, the magnetic sensor 50 may be disposed such that the lead wire 51 is led out in a direction perpendicular to the paper surface. This configuration allows the lead wire 51 to be connected at the front side of the first stationary magnetic body 10 to an external terminal or electronic board (not shown), so that the total length of the location detector can be reduced in the moving directions X, which allows miniaturization of the device. Thereby, it becomes possible to reduce a fabrication cost thereof.

Figure 6:
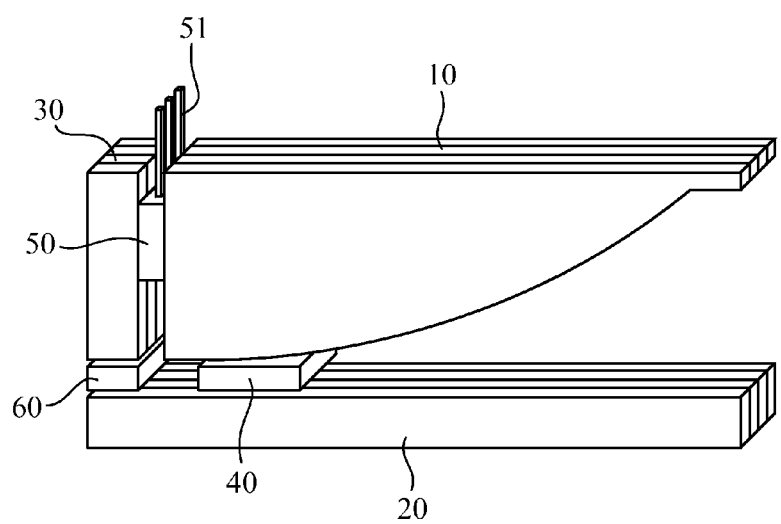
FIG. 6 is an appearance perspective view showing a modified example of the location detector according to Embodiment 1.

In addition, as shown in FIG. 6, the first stationary magnetic body 10, the second stationary magnetic body 20, and the third stationary magnetic body 30 may be constructed by laminated steel plates. When the laminated steel plates are used, an eddy current produced in the first stationary magnetic body 10, the second stationary magnetic body 20, and the third stationary magnetic body 30 are suppressed, which leads to an accuracy improvement thereof.

Further, the configurations in FIG. 5 and FIG. 6 may be combined.

Moreover, in the cases of FIG. 1 to FIG. 6, the first stationary magnetic body 10, the second stationary magnetic body 20, the third stationary magnetic body 30, the magnetic field generating body 40, and the permanent magnet 60 are disposed on the same plane to thereby constitute the two-dimensional magnetic circuit; however, they may also constitute a three-dimensional magnetic circuit. An example is shown in FIG. 7 to FIG. 9.

Figure 7:
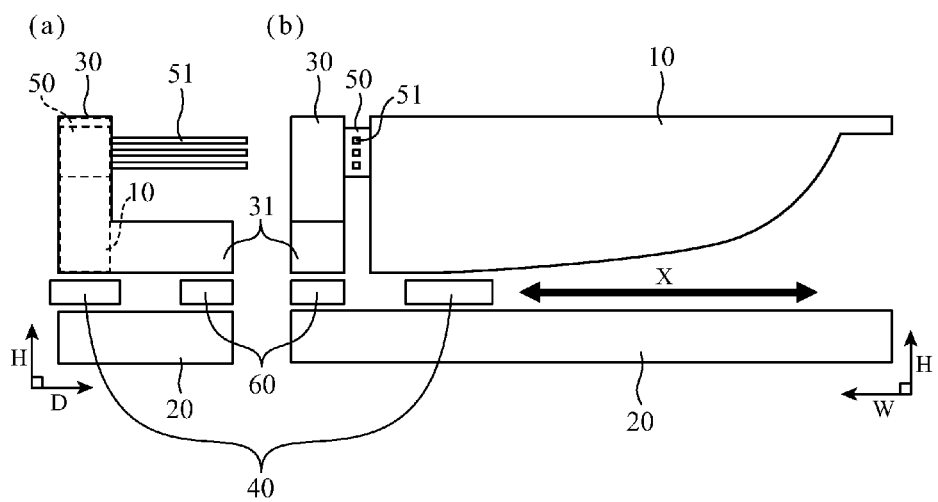
FIG. 7 shows a modified example of the location detector according to Embodiment 1.

FIG. 7 is a modified example of the location detector according to Embodiment 1: a side view is shown in FIG. 7(*a*); and a front view is shown in FIG. 7(*b*). Also, in FIG. 7, an up-down direction in the paper is represented as a height direction H, a right-left direction in the paper is represented as a width direction W, and a front-back direction in the paper is represented as a depth direction D. In this modified example, the second stationary magnetic body 20 is made thicker in the depth direction D. Also, a portion of the third stationary magnetic body 30 facing the second stationary magnetic body 20 is extended in the depth direction D to form a protruding portion 31. Then, the permanent magnet 60 is disposed between a tip side of the protruding portion 31 and the second stationary magnetic body 20. Accordingly, the magnetic generating body 40 and the permanent magnet 60 are not arranged straight on an extension line in the moving directions X, which results in a condition displaced from each other in the depth direction D; however, a position of the magnetic field generating body 40 can be detected in the same manner as mentioned above because the three-dimensional magnetic circuit is formed.

Figure 8:
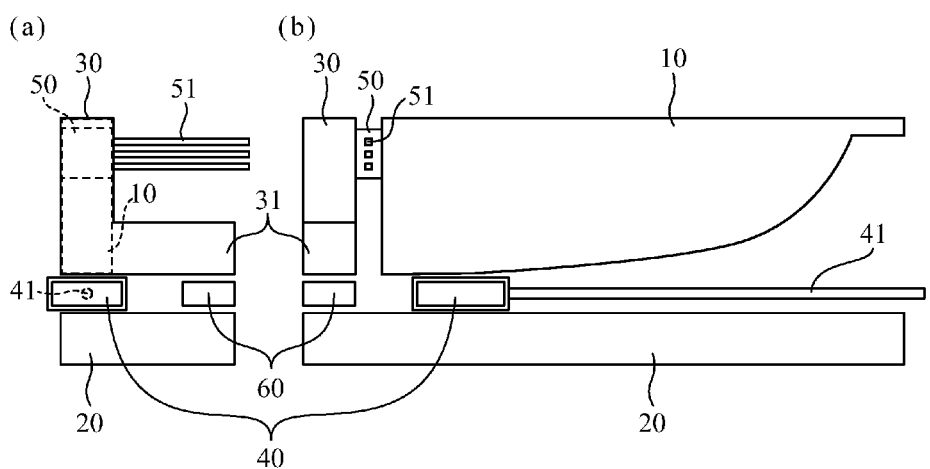
FIG. 8 shows an attaching example of a drive shaft in the location detector shown in FIG. 7.
Figure 9:
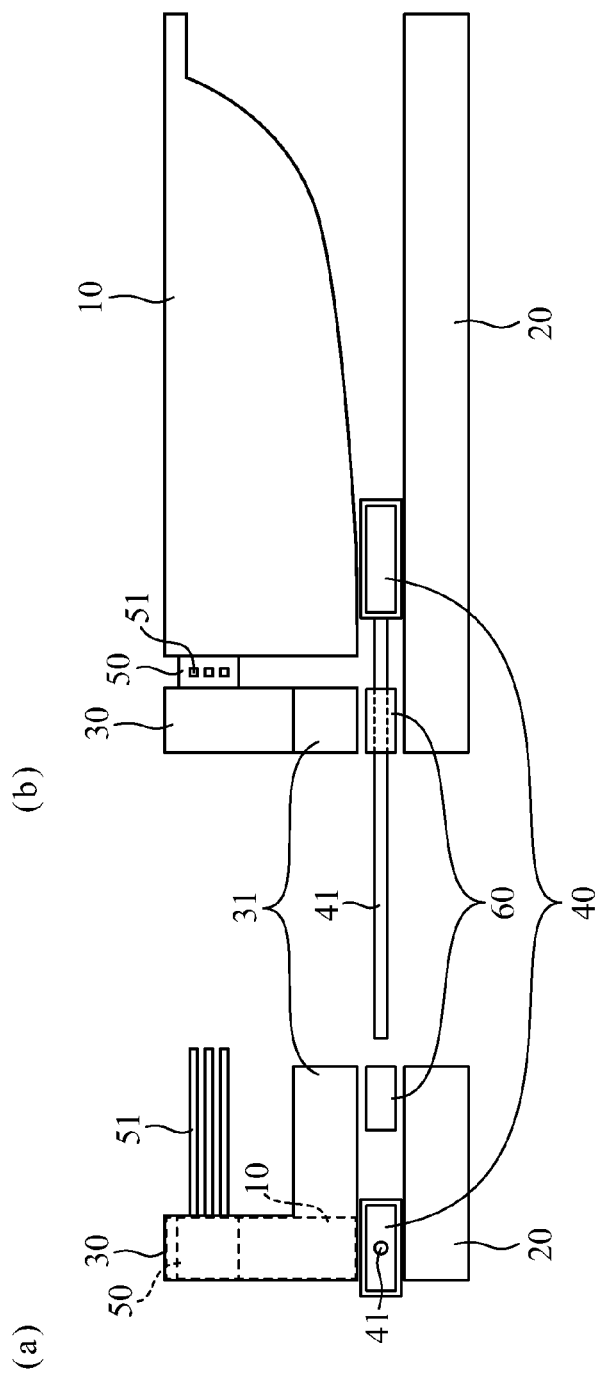
FIG. 9 shows an attaching example of the drive shaft in the location detector shown in FIG. 7.

In the location detector shown in FIG. 7, attaching examples of the drive shaft 41 are shown in FIG. 8 and FIG. 9.

In the example of FIG. 8, the drive shaft 41 is attached to a reverse side of the magnetic field generating body 40 opposite to the permanent magnet 60. In contrast, in the example of FIG. 9, the drive shaft 41 is attached to a side of the magnetic field generating body 40 facing the permanent magnet 60. Since the magnetic field generating body 40 and the permanent magnet 60 are not arranged on a straight line, there is no risk that the drive shaft 41 contacts the permanent magnet 60 even if attached to the side of the permanent magnet 60. In the examples of FIG. 8 and FIG. 9, the magnetic field generating body 40 is covered with a resin, and the magnetic field generating body 40 is unified with the drive shaft 41 by the resin.

In this manner, when the permanent magnet 60 is placed at a position displaced from the extension line in the moving range of the magnetic field generating body 40, the drive shaft 41 can be disposed on both sides in the width direction W of the location detector.

As described above, according to Embodiment 1, the location detector is configured to include: the magnetic field generating body 40 having the polar surface of the N-pole, and the polar surface of the S-pole on its reverse side, and attached to the reciprocating drive shaft 41 to move in the directions perpendicular to the magnetic pole direction in which the N and S poles are aligned; the first stationary magnetic body 10 having the curved portion 11, and disposed opposite to one of the polar surfaces of the magnetic field generating body 40; the second stationary magnetic body 20 disposed at the position opposite to the other of the polar surfaces of the magnetic field generating body 40, and having the linear portion 21 parallel to the moving directions X, said linear portion being opposite to the curved portion 11 of the first stationary magnetic body 10 with the magnetic field generating body 40 interposed therebetween; the third stationary magnetic body 30 disposed side by side with the first stationary magnetic body 10 at the position opposite to the second stationary magnetic body 20; the magnetic sensor 50 placed in the state sandwiched between opposite surfaces of the first stationary magnetic body 10 and the third stationary magnetic body 30, said sensor detecting the location of the magnetic field generating body 40 due to the fact that when the distance in the magnetic pole direction between the magnetic field generating body 40 and the first stationary magnetic body 10 varies according to a reciprocating movement of the drive shaft 41, the magnetic flux passing therethrough is changed; and the permanent magnet 60 placed between opposite surfaces of the second stationary magnetic body 20 and the third stationary magnetic body 30 in such a manner that zero is included in the detection range in magnetic flux density thereof when the magnetic flux passing through the magnetic sensor 50 is changed. For this reason, the correction and adjustment of the magnetic sensor 50 can be performed in the state of zero in the magnetic flux density. Thus, the location detector achieving an improvement of the accuracy based on the correction and adjustment can be obtained.

Further, according to Embodiment 1, since the offset amount of the magnetic flux density can be adjusted by changing the magnetic force or material of the permanent magnet 60, the detection range of the magnetic flux density by the magnetic sensor 50 can be adjusted, and/or the position of the magnetic field generating body 40 attaining zero in the magnetic flux density can be adjusted.

Embodiment 2

The configuration in the above Embodiment 1 is provided such that the magnetic flux density passes through zero within the moving range of the magnetic field generating body 40, while a configuration in Embodiment 2 is provided such that the magnetic flux density attains zero at an end portion of the moving range. It is noted that a location detector of Embodiment 2 has a similar configuration in the drawings to the location detector shown in FIG. 1 and FIG. 4, and a description will be given with the aid of FIG. 1 and FIG. 4 in the following.

Figure 10:
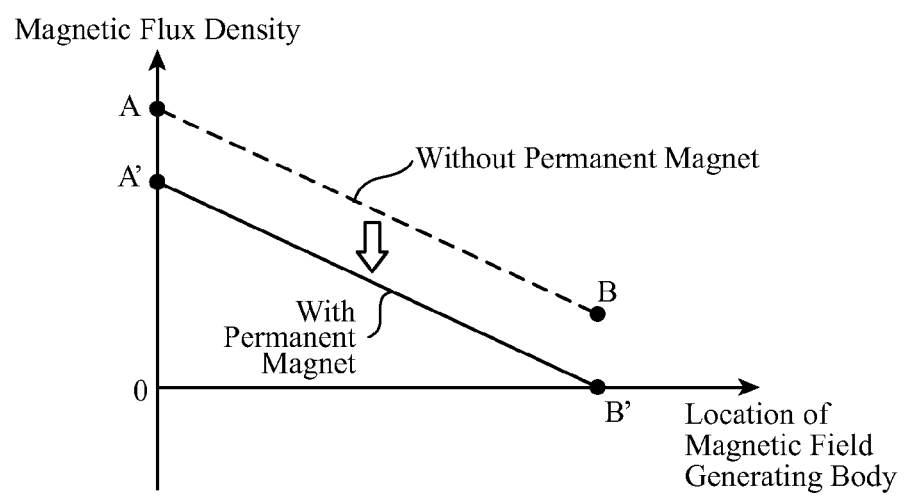
FIG. 10 is a graph showing a magnetic flux density detected by a magnetic sensor in a location detector according to Embodiment 2 of the invention: a broken line is a case without a permanent magnet; and a solid line is a case with the permanent magnet.

FIG. 10 is a graph of a magnetic flux density detected by a magnetic sensor 50: a broken line represents a case without a permanent magnet 60, and a solid line represents a case with a permanent magnet 60. In the graph, magnetic flux densities at positions A, A', B, and B' correspond to magnetic flux densities detected by the magnetic sensor 50 at the positions A, A', B, and B' of the magnetic field generating body 40 in FIG. 2 and FIG. 4, respectively. In the present Embodiment 2, the permanent magnet 60 is used to apply an bias thereto such that the magnetic flux density attains zero when the magnetic field generating body 40 is located at one end side (B') in the moving range.

From the above, according to Embodiment 2, the location detector is configured to use the permanent magnet 60 that works to attain zero in the magnetic flux density detected by the magnetic sensor 50 at the one end side in the moving range of the magnetic field generating body 40. In such a way, since an absolute location of the magnetic field generating body 40 is determined at the moment that attains a zero state in the magnetic flux density, it is concluded that a correction and an adjustment of the magnetic sensor 50 have only to be performed at the time when the magnetic field generating body 40 is located at the one end in the moving range. Thus, an operation for the collection and adjustment can be simplified.

In particular, after the location detector is mounted on an actuator and so on with a programmable sensor such as a Hall IC used as the magnetic sensor 50 in a case where a parameter to be used in the correction and adjustment is written thereinto, the parameter has only to be determined in the zero state in the magnetic flux density where the magnetic field generator 40 is located at the one end of the moving range to be written thereinto, thus resulting in facilitation of an operation thereof.

Alternatively, the permanent magnet 60 that works to attain zero in the magnetic flux density at the time when the magnetic field generating body 40 is located at the center in the moving range may be used. In this case, the correction and adjustment have only to be performed in a state where the magnetic field generating body 40 is aligned at the center position of the moving range.

Embodiment 3

Figure 11:
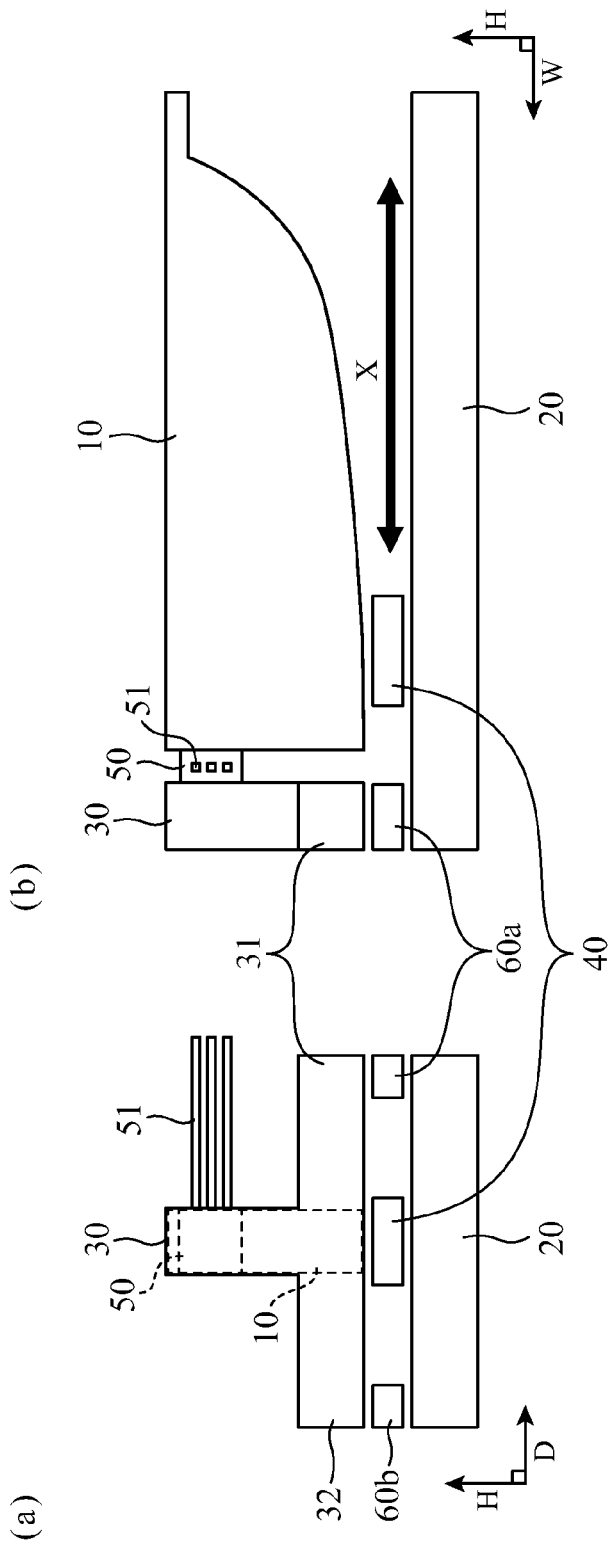
FIG. 11 shows a location detector according to Embodiment 3 of the invention.

FIG. 11 is a diagram showing a location detector according to Embodiment 3 of the present invention. Note that in FIG. 11, the same reference numerals are given for the same or equivalent parts as/to those in FIG. 7, and descriptions thereof will be omitted.

In the present Embodiment 3, a portion of a third stationary magnetic body 30 to face a second stationary magnetic body 20 is extended in one depth direction D to form a protruding portion 31, and also extended in the other depth direction D to form a protruding portion 32. In addition, a permanent magnet 60 is divided into two permanent magnets 60*a* and 60*b*; the permanent magnet 60*a* is disposed between opposite surfaces of the protruding portion 31 and the second stationary magnetic body 20, and the permanent magnet 60*b* is disposed between opposite surfaces of the protruding portion 32 and the second stationary magnetic body 20. Thus, the magnetic generating body 40 and the permanent magnets 60*a*, 60*b* are not arranged straight on an extension line in moving directions X, and are put in a state displaced from each other in a depth direction D; however, a three-dimensional magnetic circuit is formed, and hence a location of the magnetic field generating body 40 can be detected like the above Embodiments 1 and 2.

Note that a combined magnetic flux of magnetic fluxes generated by the divided permanent magnets 60*a*, 60*b* is equivalent to the magnetic flux generated by the permanent magnet 60 shown in FIG. 1 to FIG. 10.

Figure 12:
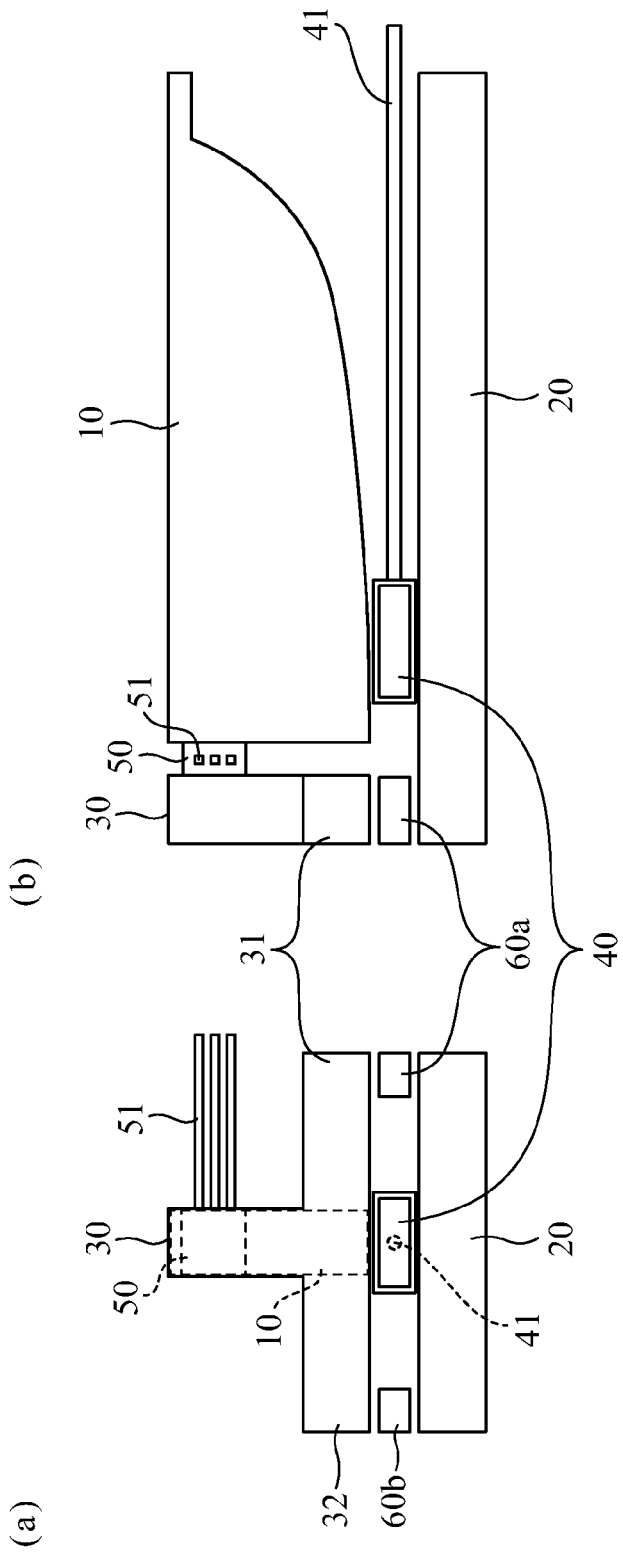
FIG. 12 shows an attaching example of a drive shaft in the location detector shown in FIG. 11.
Figure 13:
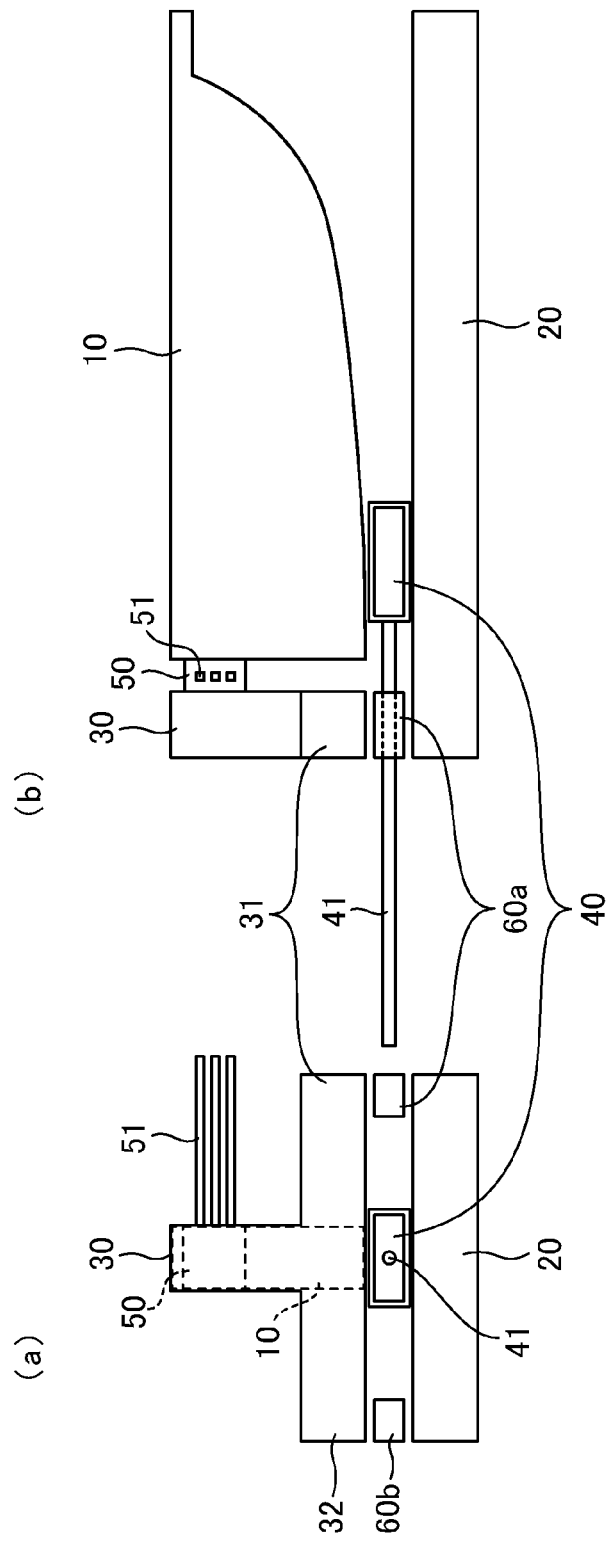
FIG. 13 shows an attaching example of the drive shaft in the location detector shown in FIG. 11.

Attaching examples of a drive shaft 41 in the location detector shown in FIG. 11 are shown in FIG. 12 and FIG. 13.

In the example of FIG. 12, the drive shaft 41 is attached to the side of the magnetic field generating body 40 opposite to the permanent magnets 60*a*, 60*b*. On the other hand, in the example of FIG. 13, the drive shaft 41 is attached to the magnetic field generating body at the side facing toward the permanent magnet 60*a*, 60*b*. Since the magnetic field generating body 40 and the permanent magnets 60*a*, 60*b* are not arranged on a straight line, there is no risk that the drive shaft 41 contacts the permanent magnets 60*a*, 60*b* even if attached to the side of the permanent magnets 60*a*, 60*b*.

From the above, according to Embodiment 3, since the location detector is configured that the plurally divided permanent magnets 60*a*, 60*b* are disposed at the positions displaced from the moving direction of the magnetic field generating body 40, the drive shaft 41 can be disposed at both sides of the location detector in a width direction W thereof.

Embodiment 4

Figure 14:
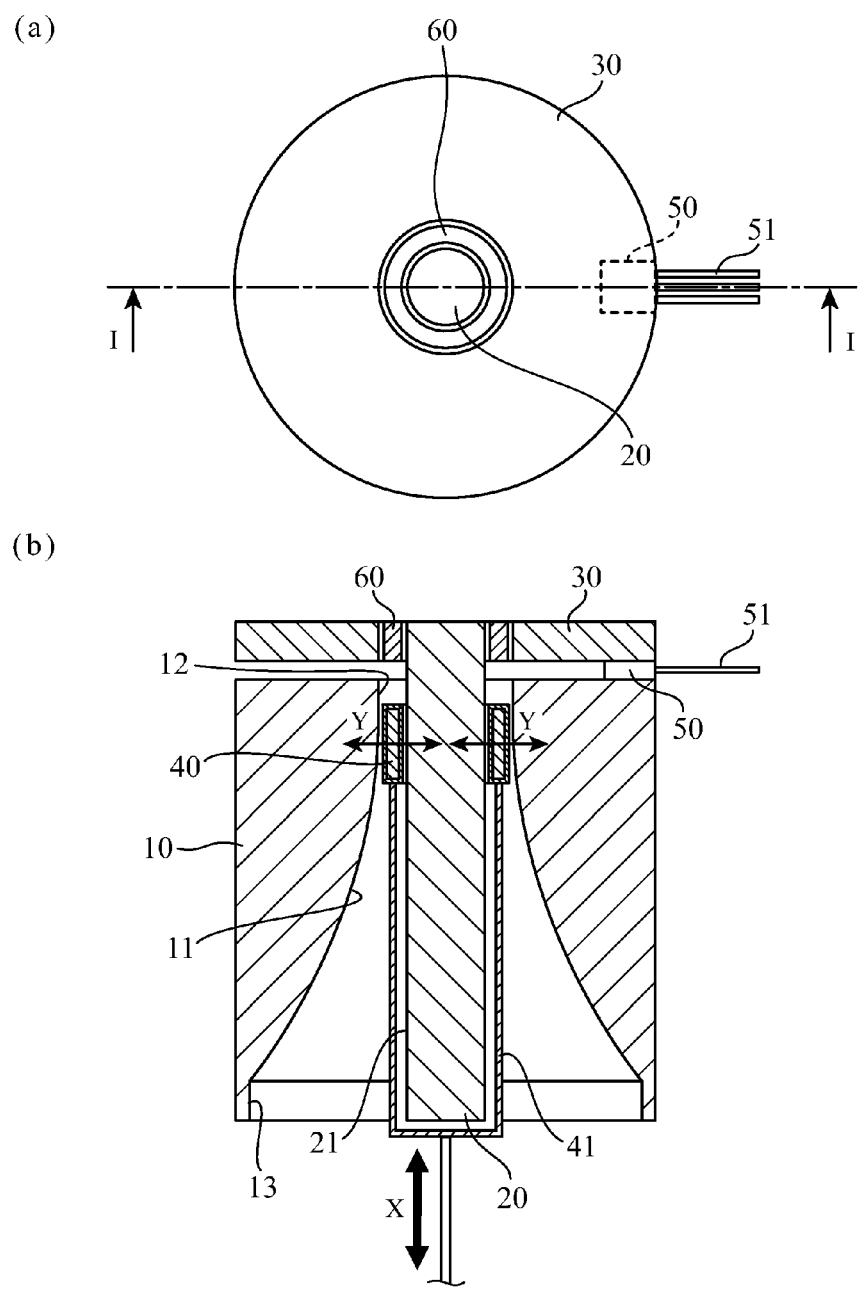
FIG. 14 shows a location detector according to Embodiment 4 of the invention.

FIG. 14 shows a location detector according to Embodiment 4 of the present invention: FIG. 14(*a*) is a plan view; and FIG. 14(*b*) is a cross-sectional view taken along a line I-I as indicated with arrows. Note that in FIG. 14, the same reference numerals are given for the same or equivalent parts as/to in FIG. 1, and descriptions thereof will be omitted.

As shown in FIG. 14, the location detector according to Embodiment 4 is constructed in a columnar shape. Specifically, a first stationary magnetic body 10 is formed cylindrically; both end portions of its inner circumferential surface are formed by linear portions 12, 13, and a diameter of the inner circumferential surface between the linear portions 12, 13 is changed in an axial direction thereof to form a curved portion 11. A third stationary magnetic body 30 is also formed cylindrically, and is disposed on the same axis as that of the first stationary magnetic body 10. On the other hand, a second stationary magnetic body 20 is formed in a columnar shape, and is disposed inside each of the first stationary magnetic body 10 and third stationary magnetic body 30. An outer circumferential surface of the second stationary magnetic body 20 is provided for a linear portion 21.

A magnetic field generating body 40 is formed cylindrically; a radial direction thereof corresponds to a magnetic pole direction Y, and axial directions correspond to moving directions X thereof. The magnetic field generating body 40 is disposed between the inner circumferential surface of the first stationary magnetic body 10 and the outer circumferential surface of the second stationary magnetic body 20. In addition, the magnetic field generating body 40 is covered with a resin and is unified with the drive shaft 41 by the resin. The drive shaft 41 is given by a bottom-shaped cylinder, and the magnetic field generating body 40 is attached to an open end surface thereof, and a shaft is formed at a bottom surface thereof.

The permanent magnet of the magnetic filed generating body 40 and the permanent magnet 60 each are a radial anisotropic ring magnet; for example, an inner circumferential surface side thereof is determined as an N-pole, and an outer circumferential surface side thereof is determined as an S-pole in magnetic field orientation. Contrarily, the inner circumferential surface side may be determined as the S-pole, and the outer circumferential surface side may be determined as the N-pole.

A magnetic sensor 50 is disposed in a state sandwiched between opposite surfaces of the first stationary magnetic body 10 and the third stationary magnetic body 30. Also, the permanent magnet 60 is formed cylindrically and is disposed between the inner circumferential surface of the third stationary magnetic body 30 and the outer circumferential surface of the second stationary magnetic body 20. Though it is assumed that the magnetic sensor 50 detects a location of the magnetic field generating body 40 that moves in the moving directions X, since the magnetic field generating body 40 is formed in a columnar shape, even if an axial displacement thereof arises in the radial direction (the same direction as the magnetic pole direction Y), a gap on one side thereof is expanded, and a gap on the opposite side is narrowed by that expansion, so that an effect of the axial displacement produced on a magnetic flux density thereof is cancelled. Accordingly, even if a displacement of the magnetic field generating body 40 arises in the radial direction, it is possible to ensure location detecting accuracy thereof.

Figure 15:
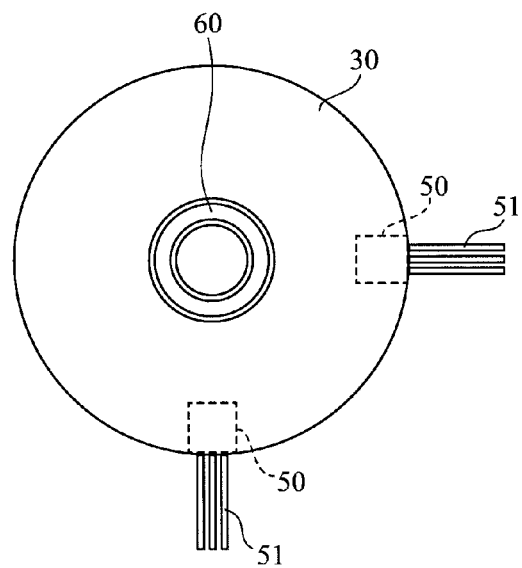
FIG. 15 is a plan view showing a modified example of the location detector according to Embodiment 4.
Figure 16:
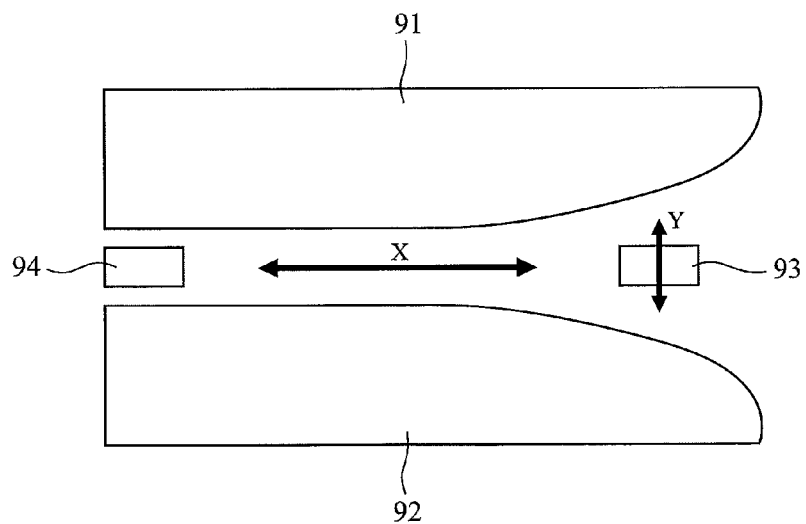
FIG. 16 is a front view showing a basic configuration of a conventional location detector.

It is noted that since the first stationary magnetic body 10 and the third stationary magnetic body 30 are formed in the cylindrical shape, a layout area of the magnetic sensor 50 becomes broader; thus, the plurality of magnetic sensors 50 may be placed therein so as to establish a redundancy thereof. FIG. 15 shows a plan view of the location detector placed with two magnetic sensors 50. Although two of the magnetic sensors 50 are disposed in the case of FIG. 15, three or more of the magnetic sensors 50 may be disposed.

From the above, according to Embodiment 4, the location detector is configured as follows:

the first stationary magnetic body 10 is formed in the cylindrical shape, and has the curved portion 11 such that the diameter of the inner circumferential surface thereof is changed in the axial direction thereof; the third stationary magnetic body 30 is formed in the cylindrical shape, and disposed side by side on the same axis with the first stationary magnetic body 10; the second stationary magnetic body 20 is formed in the columnar shape, and disposed inside each of the first stationary magnetic body 10 and third stationary magnetic body 30; the magnetic field generating body 40 is formed in the cylindrical shape such that the inner and outer circumferential surfaces thereof have the polar surfaces, and is disposed between the inner circumferential surface of the first stationary magnetic body 10 and the outer circumferential surface of the second stationary magnetic body 20 to move in the axial direction; the magnetic sensor 50 is disposed in the state sandwiched between the opposite surfaces of the first stationary magnetic body 10 and the third stationary magnetic body 30, and the permanent magnet 60 is formed in the cylindrical shape, and is disposed between the inner circumferential surface of the third stationary magnetic body 30 and the outer circumferential surface of the second stationary magnetic body 20. For this reason, the displacement of the magnetic field generating body 40 in the magnetic pole direction Y can be canceled, thereby ensuring location detection accuracy thereof.

It is noted that in the above Embodiments 1 to 4, although the first stationary magnetic body 10, the second stationary magnetic body 20 and the third stationary magnetic body 30 have only to be a magnetic body, it is more preferable that these bodies are formed of laminated steel plates. This is because when the laminated steel plates are used, an eddy current to be produced in the first stationary magnetic body 10, the second stationary magnetic body 20, and the third stationary magnetic body 30 can be suppressed, which leads to an easy detection by the magnetic sensor 50 of the magnetic flux in the magnetic field generating body 40.

Instead, these maybe formed of dust cores. The eddy current can be suppressed like the laminated steel plates.

It is noted that the present invention can be implemented by a free combination of the embodiments, a modification of arbitrary components of the embodiments, or an omission of arbitrary components of the embodiments, within the scope of the invention.

Industrial Applicability

As described above, in the location detector according to the present invention, since the correction and adjustment of the temperature characteristic and the like of the magnetic sensor can be performed with high accuracy in the state of zero in the magnetic flux density, it is suitable for a use under a high temperature condition, for example, in a location detector that detects a shaft location of an actuator for driving a throttle valve, an EGR (Exhaust Gas Recirculation) valve, a WG (Waste Gate) valve, a movable vane in a VG (Variable Geometric) turbo system, and the like that are to be mounted in vehicles.

Explanation of Reference Symbols

10: first stationary magnetic body, 11: curved portion, 12, 13: linear portions, 20: second stationary magnetic body, 21: linear portion, 30: third stationary magnetic body, 31, 32: protruding portion, 40: magnetic field generating body, 41: drive shaft, 50: magnetic sensor, 60, 60a, 60b: permanent magnet, 91: first stationary magnetic body, 92: second stationary magnetic body, 93: magnetic field generating body, 94: magnetic sensor.

The invention claimed is:

1. A location detector comprising:
   a magnetic field generating body having a polar surface of N-pole, and a polar surface of S-pole on its reverse side, and attached to a reciprocating drive shaft to move in directions perpendicular to a magnetic pole direction in which the N and S poles are aligned;
   a first stationary magnetic body having a curved portion, and disposed opposite to one of the polar surfaces of the magnetic field generating body;
   a second stationary magnetic body disposed at a position opposite to the other of the polar surfaces of the magnetic field generating body, and having a linear portion that is parallel to the moving directions of the magnetic field generating body, said linear portion being opposite to the curved portion of the first stationary magnetic body with the magnetic field generating body interposed therebetween;
   a third stationary magnetic body disposed side by side with the first stationary magnetic body at a position opposite to the second stationary magnetic body;
   a magnetic sensor placed in a state sandwiched between opposite surfaces of the first stationary magnetic body and the third stationary magnetic body, said sensor detecting a location of the magnetic field generating body due to the fact that when a distance in the magnetic pole direction between the magnetic field generating body and the first stationary magnetic body varies according to a reciprocating movement of the drive shaft, a magnetic flux passing therethrough is changed; and
   a permanent magnet placed between opposite surfaces of the second stationary magnetic body and the third stationary magnetic body in such a manner that zero is included in a detection range in magnetic flux density thereof when the magnetic flux passing through the magnetic sensor is changed.

2. The location detector according to claim 1, wherein the permanent magnet works to attain zero in the magnetic flux density detected by the magnetic sensor at one end side in a moving range of the magnetic field generating body.

3. The location detector according to claim 1, wherein the permanent magnet generates a magnetic flux that is equivalent to or lower than that generated by the magnetic field generating body.

4. The location detector according to claim 1, wherein the permanent magnet is made of a material that is different from that of a permanent magnet used in the magnetic field generating body.

5. The location detector according to claim 1, wherein the permanent magnet is divided into a plurality of parts to be disposed at a position displaced from a moving direction of the magnetic field generating body.

6. The location detector according to claim 1, wherein:
- the first stationary magnetic body is formed in a cylindrical shape, and has a curved portion such that a diameter of an inner circumferential surface thereof is changed in an axial direction thereof;
- the third stationary magnetic body is formed in a cylindrical shape, and disposed side by side on the same axis with the first stationary magnetic body;
- the second stationary magnetic body is formed in a columnar shape, and disposed inside each of the first stationary magnetic body and third stationary magnetic body;
- the magnetic field generating body is formed in a cylindrical shape such that inner and outer circumferential surfaces thereof have the polar surfaces, and is disposed between an inner circumferential surface of the first stationary magnetic body and an outer circumferential surface of the second stationary magnetic body to move in the axial direction;
- the magnetic sensor is disposed in a state sandwiched between the opposite surfaces of the first stationary magnetic body and the third stationary magnetic body, and
- the permanent magnet is formed in a cylindrical shape, and is disposed between an inner circumferential surface of the third stationary magnetic body and the outer circumferential surface of the second stationary magnetic body.

\* \* \* \* \*